(12) United States Patent
Pellizzer et al.

(10) Patent No.: US 7,439,536 B2
(45) Date of Patent: Oct. 21, 2008

(54) PHASE CHANGE MEMORY CELL WITH TUBULAR HEATER AND MANUFACTURING METHOD THEREOF

(76) Inventors: Fabio Pellizzer, Via Peroz, 16, Follina (IT) 31051; Enrico Varesi, Via Brioschi, 5, Milan (IT) 20136; Agostino Pirovano, Via Don A. Barera, 10, Corbetta (IT) 20011

( * ) Notice: Subject to any disclaimer, the term of this patent is extended or adjusted under 35 U.S.C. 154(b) by 37 days.

(21) Appl. No.: 11/398,858

(22) Filed: Apr. 6, 2006

(65) Prior Publication Data

US 2007/0051936 A1 Mar. 8, 2007

(30) Foreign Application Priority Data

Apr. 8, 2005 (EP) .................... 05102811

(51) Int. Cl.
*H01L 47/00* (2006.01)
(52) U.S. Cl. ........... 257/3; 257/2; 257/4; 257/E45.002; 257/E45.003; 438/102; 438/103
(58) Field of Classification Search ............. 438/257, 438/900; 257/2, 3, 4, 296, 379, E21.006, 257/E21.004, E21.585
See application file for complete search history.

(56) References Cited

U.S. PATENT DOCUMENTS 6,969,866 B1 * 11/2005 Lowrey et al. ............. 257/3

| | | | |
|---|---|---|---|
| 2002/0195621 A1 * | 12/2002 | Maimon | 257/200 |
| 2003/0001230 A1 * | 1/2003 | Lowrey | 257/529 |
| 2003/0214856 A1 | 11/2003 | Pellizzer et al. | 365/200 |
| 2003/0219924 A1 | 11/2003 | Bez et al. | 438/102 |
| 2004/0114317 A1 | 6/2004 | Chiang et al. | 361/683 |
| 2004/0238920 A1 | 12/2004 | Hashimoto et al. | |

FOREIGN PATENT DOCUMENTS

EP 1675183 A1 6/2006
WO WO 02/09206 A1 1/2002

* cited by examiner

*Primary Examiner*—Matthew C. Landau
*Assistant Examiner*—Minchul Yang
(74) *Attorney, Agent, or Firm*—Blakely, Sokoloff, Taylor & Zafman LLP

(57) ABSTRACT

A phase change memory cell includes a phase change region of a phase change material, a heating element of a resistive material, arranged in contact with the phase change region and a memory element formed in said phase change region at a contact area with the heating element. The contact area is in the form of a frame that has a width of sublithographic extent and, preferably, a sublithographic maximum external dimension. The heating element includes a hollow elongated portion which is arranged in contact with the phase change region.

33 Claims, 9 Drawing Sheets

PHASE CHANGE MEMORY CELL WITH TUBULAR HEATER AND MANUFACTURING METHOD THEREOF

BACKGROUND OF THE INVENTION

1. Field of the Invention

The present invention relates to a phase change memory cell with tubular heater and to a manufacturing method thereof.

2. Description of the Related Art

As is known, phase change memories use a class of materials that have the property of switching between two phases having distinct electrical characteristics, associated with two different crystallographic structures of the material, and precisely an amorphous, disorderly phase and a crystalline or polycrystalline, orderly phase. The two phases are hence associated with resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has been also proposed for mass storage.

In the chalcogenides, the resistivity varies by two or more orders of magnitude when the material passes from the amorphous (more resistive) phase to the crystalline (more conductive) phase, and vice versa.

Phase change can be obtained by locally increasing the temperature. Below 150° C., both phases are stable. Starting from an amorphous state, and rising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

Memory devices exploiting the properties of chalcogenic material (also called phase change memory devices) have been already proposed.

In a phase change memory including chalcogenic elements as storage elements, a plurality of memory cells are arranged in rows and columns to form an array. Each memory cell is coupled to a respective selection element, which may be implemented by any switching device, such as a PN diode, a bipolar junction transistor or a MOS transistor, and includes a chalcogenic region of a chalcogenide material in contact with a resistive electrode, also called heater. A storage element is formed at a contact area between the chalcogenide region and the heater. The heater is connected to a conduction terminal of the selection element.

In fact, from an electrical point of view, the crystallization temperature and the melting temperature are obtained by causing an electric current to flow through the resistive electrode in contact or close proximity with the chalcogenic material and thus heating the chalcogenic material by Joule effect.

In particular, when the chalcogenic material is in the amorphous, high resistivity state (also called the reset state), it is necessary to apply a voltage/current pulse of a suitable length and amplitude and allow the chalcogenic material to cool slowly. In this condition, the chalcogenic material changes its state and switches from a high resistivity to a low resistivity state (also called the set state).

Vice versa, when the chalcogenic material is in the set state, it is necessary to apply a voltage/current pulse of suitable length and high amplitude so as to cause the chalcogenic material to switch to the amorphous phase.

Two types of heaters are mostly used in phase change memory devices.

So-called "lance" heaters include resistive rods having first ends in contact with the chalcogenic material and second ends connected to conduction terminals of respective selection elements. Lance heaters are made by firstly opening holes in a dielectric layer covering the selection elements, at locations corresponding to conduction terminals thereof. The holes are narrowed by formation of spacers, until a sublithographic cross-dimension is reached, and then filled with a resistive material. After a CMP (Chemical-Mechanical-Polishing) step, a chalcogenic layer of a chalcogenic material is deposited and defined, to form chalcogenic regions in contact with respective lance heaters. Accordingly, manufacture of lance heaters is very simple since only conventional process steps are involved. Despite sublithographic cross-dimensions, however, the contact areas between the lance heaters and the chalcogenic regions are quite large. In particular, minimum obtainable cross-dimension is limited by the precision in controlling the thickness of spacers formed in a deep hole. In practice, it is very difficult to form lance heaters having cross-dimensions less than 50-60 nm using a 90 nm technology. Thus, rather high currents are required to provide sufficient heating of the chalcogenic material and to cause phase transitions.

According to U.S. Pat. No. 6,816,404, to reduce the amount of current needed to cause the chalcogenic material to change its state, a "wall" heater is formed by a wall structure obtained by depositing a layer, having sublithographic thickness, of a suitable resistive material. Furthermore, the chalcogenic material includes a thin portion extending transversely to the wall structure, so as to obtain a small contact area. Wall heaters, however, are more complicated and expensive to build than lance heaters. In particular, additional masking steps are required to form the thin chalcogenic portions.

BRIEF SUMMARY OF THE INVENTION

One embodiment of the invention provides an improved phase change memory cell and a manufacturing method thereof which are free from the above-described drawbacks.

BRIEF DESCRIPTION OF THE SEVERAL VIEWS OF THE DRAWING(S)

For the understanding of the present invention, preferred embodiments thereof are now described, purely as non-limitative examples, with reference to the enclosed drawings, wherein.

DETAILED DESCRIPTION OF THE INVENTION

Figure 1:
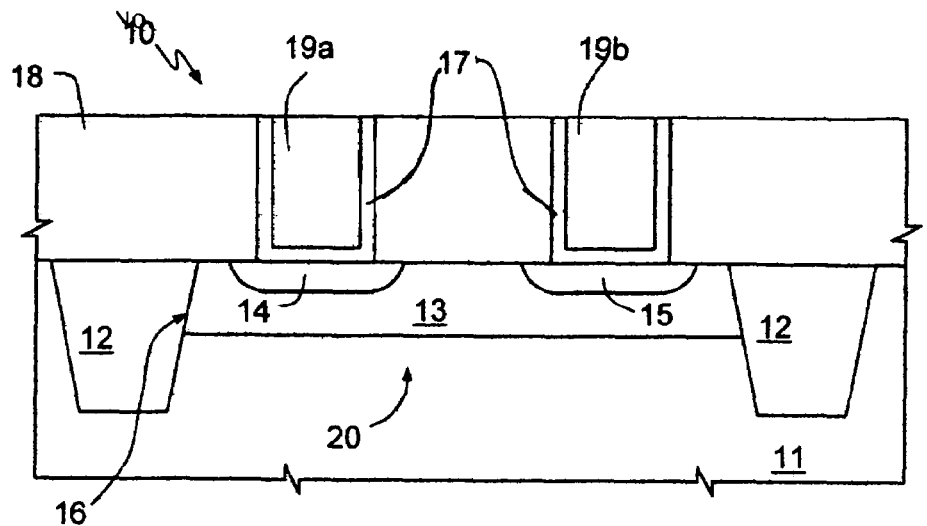
FIGS. 1-5 are cross sections through a semiconductor wafer in subsequent steps of a manufacturing process according to a first embodiment of the present invention.

With reference to FIG. 1, initially a wafer 10 comprising a substrate 11, of P-type, is subjected to standard front end steps. In particular, inside the substrate 11 insulation regions 12 are formed and delimit active areas 16; then base regions 13 of N-type are implanted. Next, a first dielectric layer 18 is deposited and planarized; circular openings are formed in the first dielectric layer 18 above the base regions 13 and emitter regions 15. At this point, using two dedicated masks and exploiting the self-alignment in the openings, base contact regions 14, of N+-type, and emitter regions 15, of P+-type, are implanted. Then the openings in the first dielectric layer 18 are covered by a barrier layer 17, for example a Ti/TiN layer, before being filled with tungsten to form base contacts 19a and emitter contacts 19b. The base contacts 19a are thus in direct electrical contact with the base regions 13, and the emitter contacts 19b are in direct electrical contact with the emitter regions 15. In this way, the structure of FIG. 1 is obtained. The base regions 13, base contact regions 14, emitter regions 15 and the substrate 11 (intrinsic collector) form selection transistors 20 for the memory cells (only one selection transistor 20 is illustrated in FIG. 1 and the following).

Figure 2:
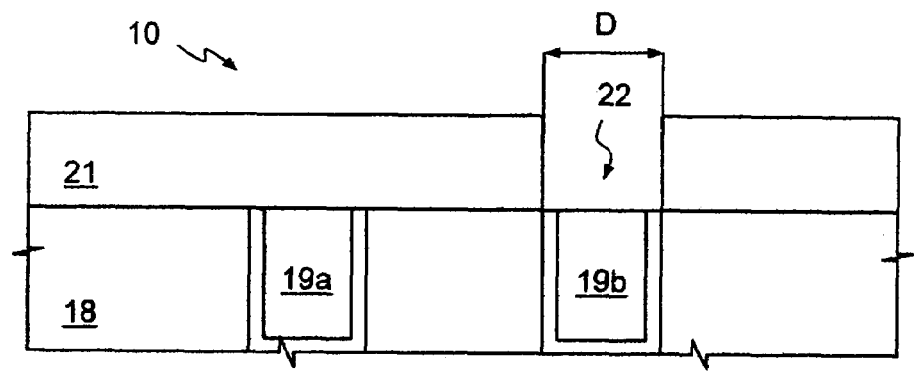

Then, FIG. 2, a second dielectric layer 21, e.g., of silicon oxide, is deposited on the wafer 10 and is etched using a lithographic process to form openings 22 above the emitter contacts 19b. The openings 22 and the emitter contacts 19b have a same (lithographic) first cross-dimension D. In the embodiment herein described, for example, the first cross-dimension D is around 120 nm.

Figure 3:
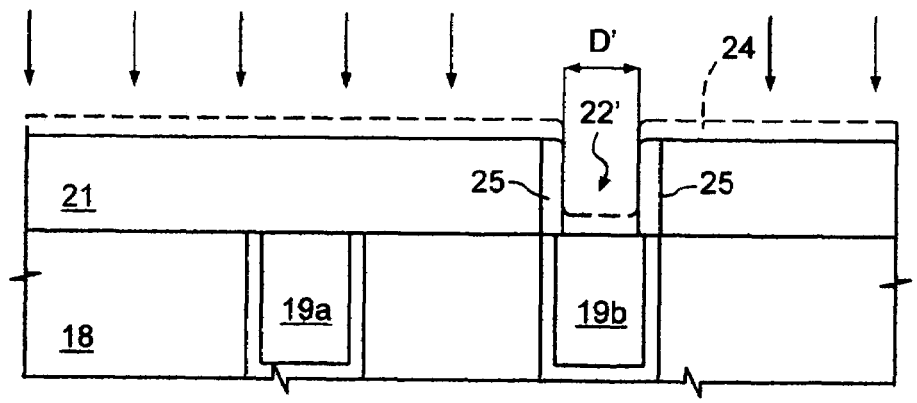

As shown in FIG. 3, a spacers layer 24, of silicon nitride and having controlled thickness, is conformally deposited on the second dielectric layer 21 and partially fills the openings 22. Accordingly, the spacers layer 24 adheres to lateral (vertical) and bottom walls of the openings 22. The spacers layer 24 is then partially removed by a vertical etch, as schematically shown by arrows in FIG. 3. In particular, flat portions of the spacers layer 24 are removed from above the second dielectric layer 21 and the emitter contacts 19b, whereas vertical portions thereof, adhering to the lateral walls of the openings 22, are left and form circular spacers 25. Hence, openings 22' are narrowed to a second cross-dimension D' preferably in the sublithographic range of 50-60 nm. Hereinafter, the term "sublithographic" means a linear dimension smaller than the minimum dimension achievable with current optical (UV) lithographic techniques, and hence smaller than 100 nm, preferably 50-60 nm, down to approximately 5-20 nm.

Figure 4:
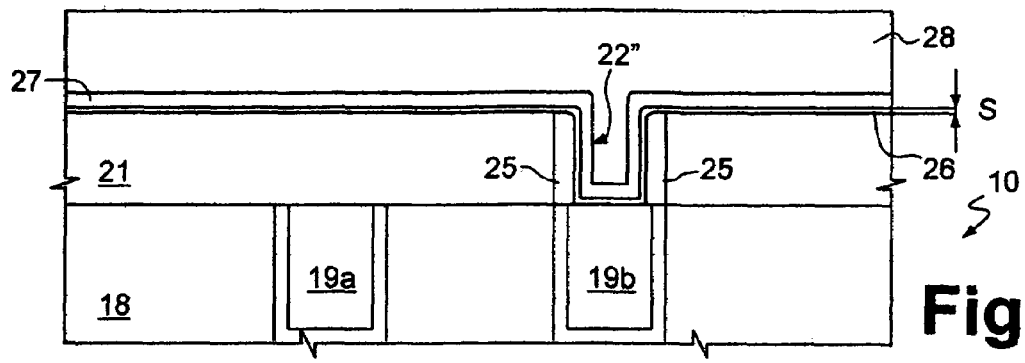

A heater layer 26, a sheath layer 27 and a third dielectric layer 28 are subsequently deposited on the wafer 10, as shown in FIG. 4. In detail, the heater layer 26 is made of a resistive material and is conformally deposited by CVD (Chemical Vapor Deposition), so that both the spacers 25 and exposed portions of the emitter contacts 19b are evenly coated. Moreover, the thickness of the heater layer 26 has a controlled sublithographic extent S, preferably in the range of 5-20 nm. The sheath layer 27, of silicon nitride, is conformally deposited, too, and coats the heater layer 26 with an even thickness both over the second dielectric layer 21 and inside the openings 22", which are further narrowed. The third dielectric layer 28, e.g., of silicon oxide is preferably formed by ALD (Atomic Layer Deposition) and completely fills the openings 22".

Figure 5:
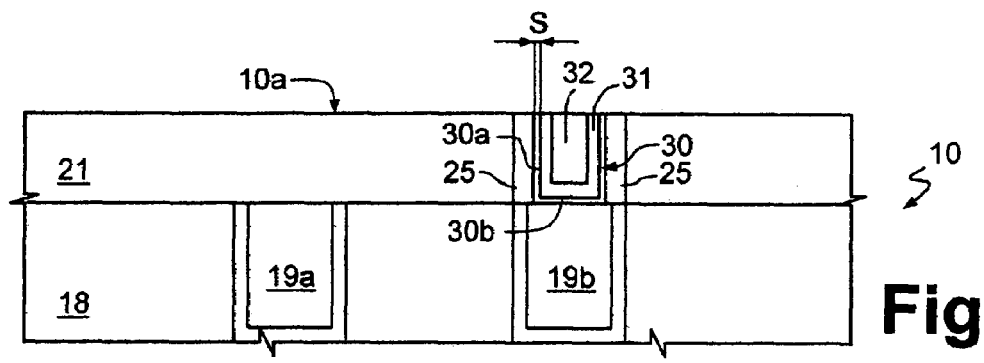

Then, FIG. 5, the wafer 10 is planarized by CMP (Chemical-Mechanical-Polishing), which is terminated on reaching the second dielectric layer 21. In practice, the third dielectric layer 28, the sheath layer 27 and the heater layer 26 are completely removed from above the second dielectric layer 21 and left on the emitter contacts 19b. Accordingly, a heater 30, a sheath film 31 and a dielectric core 32 are formed inside each opening 22 from residual portions of the heater layer 26, the sheath layer 27 and the third dielectric layer 28, respectively. The heaters 30 are generally cup-shaped and include respective hollow, elongated tubular portions 30a and bottom portions 30b, directly arranged on the emitter contacts 19b. The tubular portions 30a are defined by vertical cylindrical walls, which, of course, are as thick as the heater layer 26 in a radial direction. In other words, the radial thickness of the tubular portions 30a of the heaters 30 is the thickness of the heater layer 26 and has the sublithographic extent S. Moreover, also an external diameter of the heaters 30 is sublithographic and, more precisely, is equal to the second cross-dimension D'. The tubular portions 30a of the heaters 30 are flush with a top surface 10a of the wafer 10. Each heater 30 is separated from the respective dielectric core 32 by the respective sheath film 31 and is thus prevented from possible contamination.

Figure 6:
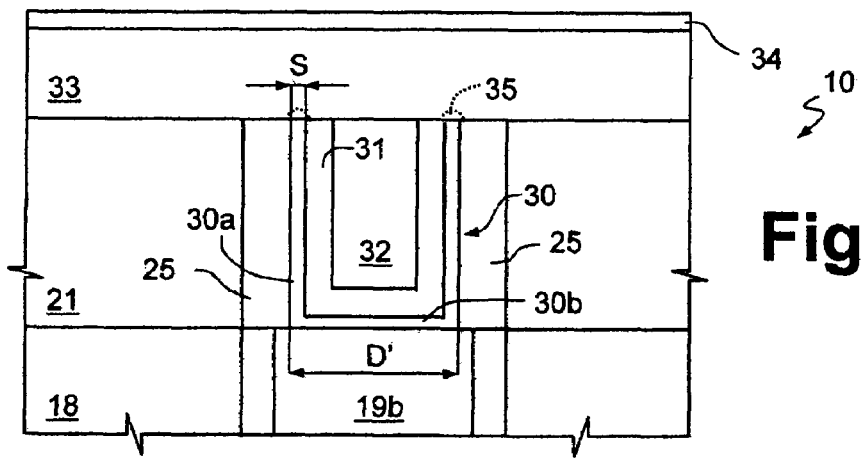
FIG. 6 is an enlarged detail of the wafer of FIGS. 1-5, in a subsequent manufacturing step.
Figure 7:
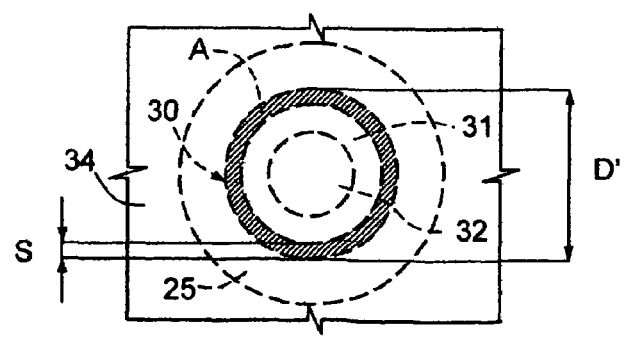
FIG. 7 is a top plan view of the wafer of FIG. 6.

Next, FIG. 6, a chalcogenic layer 33 of GST (Ge2Sb2Te5), and a cap layer 34, preferably of $Ti_xAl_yN_z$, $Ti_xSi_yN_z$ or $Ti_xN_y$, are deposited directly on the second dielectric layer 21, so that the chalcogenic layer 33 directly contacts the heaters 30. Hence, memory elements 35, having annular shape, are defined in the chalcogenic layer 33 at contact areas A with the heaters 30 (see also the top plan view of FIG. 7, where one of the contact areas A is shown by a dashed line). Of course, the contact areas A are annular and have the same external diameter as the heaters 30 (i.e., the second cross-dimension D') and a width that is equal to the sublithographic extent S.

Figure 8:
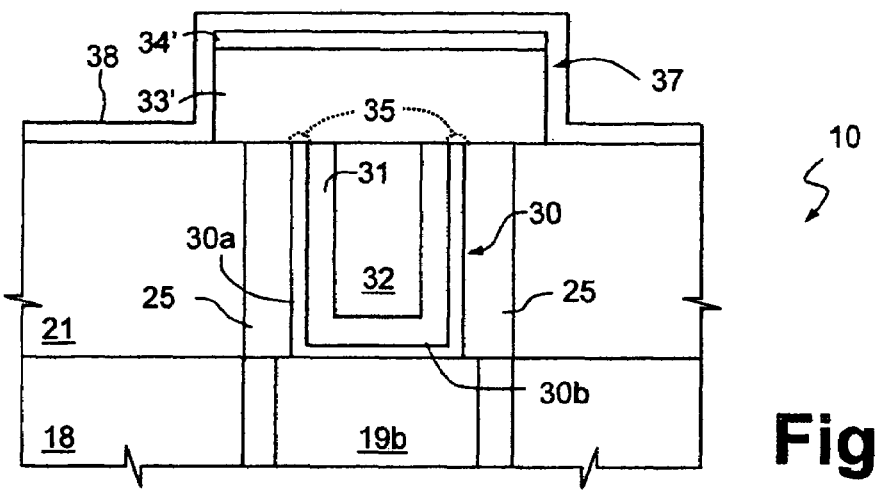
FIG. 8 shows the detail of FIG. 6 in a subsequent manufacturing step.

By a masked etch, the chalcogenic layer 33 and the cap layer 34 are then defined as illustrated in FIG. 8, to form resistive bit lines 37, which run perpendicularly to the plane of the sheet. Reference numbers 33' and 34' are used to designate chalcogenic regions and cap regions, made from residual portions of the chalcogenic layer 33 and of the cap layer 34, which form the resistive bit lines 37. A sealing layer 38 is deposited on the wafer 10 to prevent contamination of the resistive bit lines 37 during subsequent process steps.

Figure 9:
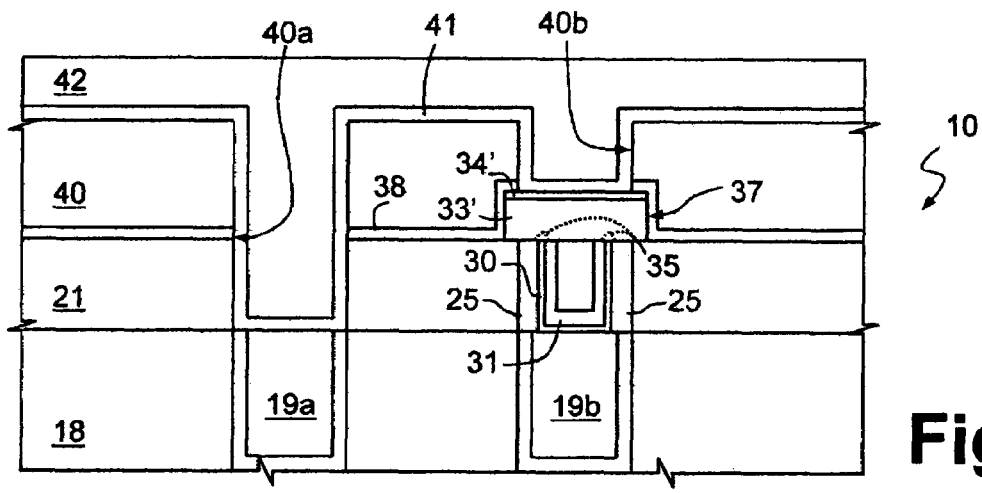
FIGS. 9 and 10 are cross sections through the wafer of FIGS. 1-8 in subsequent manufacturing steps.

Then, FIG. 9, a fourth dielectric layer 40 is deposited, which completely covers the resistive bit lines 37. The fourth dielectric layer 40 is planarized by CMP. Next, holes 40a and trenches 40b are opened above the base contacts 19a and the resistive bit lines 37, respectively, by anisotropically etching the fourth dielectric layer 40, the sealing layer 38 and the second dielectric layer 21. Holes 40a and trenches 40b are coated with a barrier layer 41, e.g., of TaN/Ta, and filled by deposition of a metal layer 42, here Cu.

Figure 10:
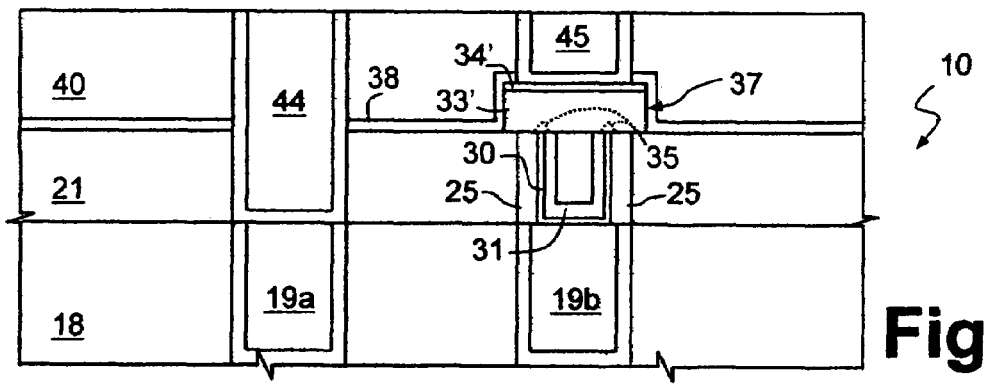

With reference to FIG. 10, the wafer 10 is planarized by CMP to remove the barrier layer 41 and the metal layer 42 outside holes 40a and trenches 40b and to form word line contacts 44 in the holes 40a and metal bit lines 45 in the trenches 40b.

Figure 11:
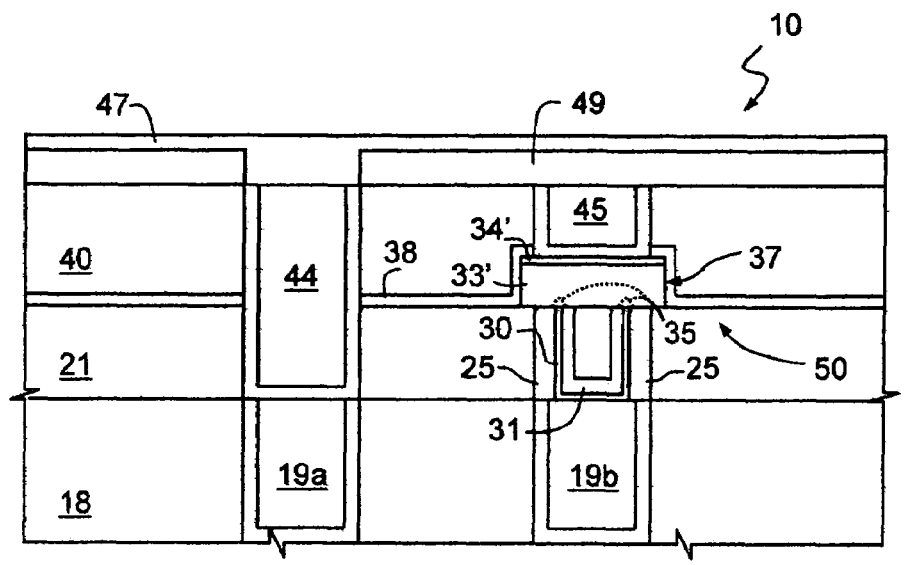
FIG. 11 is a cross section through the wafer of FIGS. 1-10, wherein a phase change memory device has been completed, according to the first embodiment of the present invention.
Figure 11A:
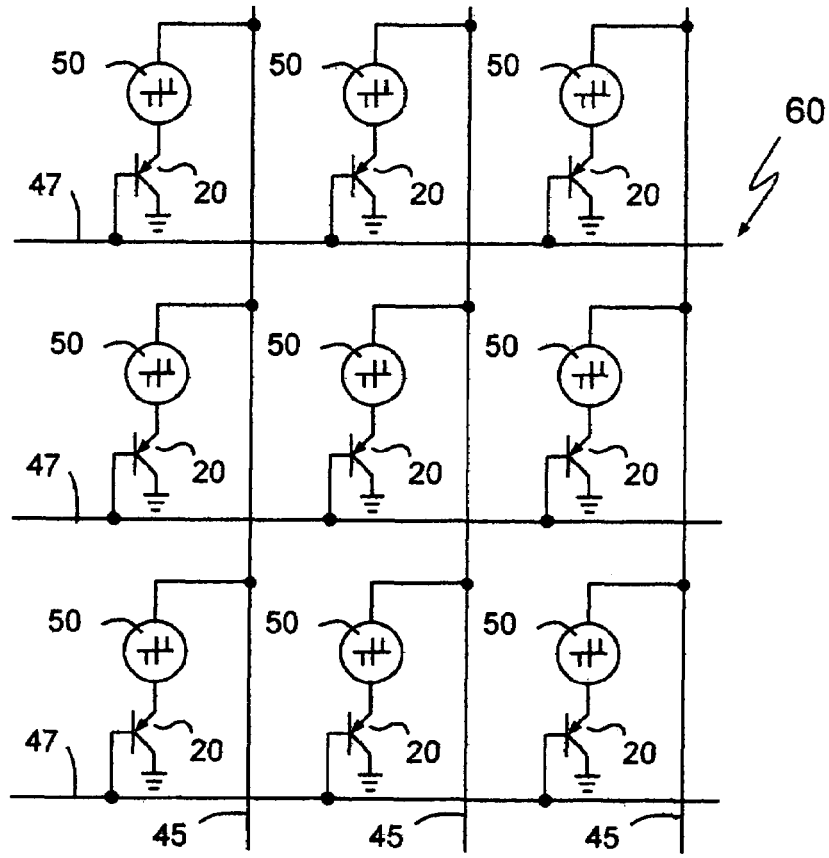
FIG. 11a is a simplified circuital diagram of the phase change memory device of FIG. 11.

Finally, conventional process steps are carried out to obtain the phase change memory cell 50 of FIG. 11. More specifically, word lines 47 are formed, which run perpendicular to the metal bit lines 45 and are separated therefrom by a fifth dielectric layer 49. At the same time the metal bit lines 45 are provided with bit line connections, here not shown. For example, a Cu-damascene technique may be used in the final process steps. FIG. 11a shows a phase change memory device 60 including a plurality of phase change memory cells 50 arranged in rows and columns and associated to respective selection transistors 20.

The advantages of the invention are clear from the above description. In particular, the heaters 30 provide contact areas A with the chalcogenic structures (resistive bit lines 37) which are much smaller as compared with the conventional lance heaters. A reduction of even 70-90% in the contact area may be achieved, so that also the currents required for controllably switching the phase of the memory elements 35 are correspondingly reduced. Nevertheless, the phase change memory device according to the invention may be manufactured by a simple and precisely controllable process, especially with respect to the fabrication of wall heaters.

Figure 12:
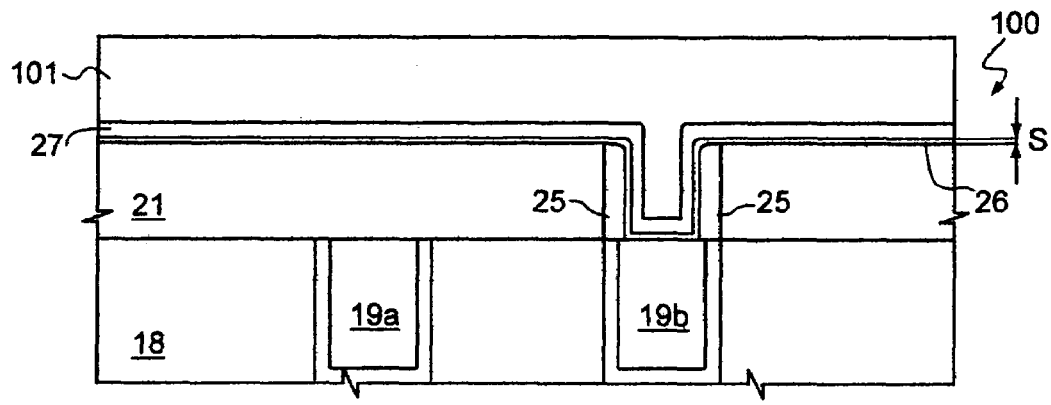
FIGS. 12-14 are cross sections through a semiconductor wafer in subsequent steps of a manufacturing process according to a second embodiment of the present invention.
Figure 13:
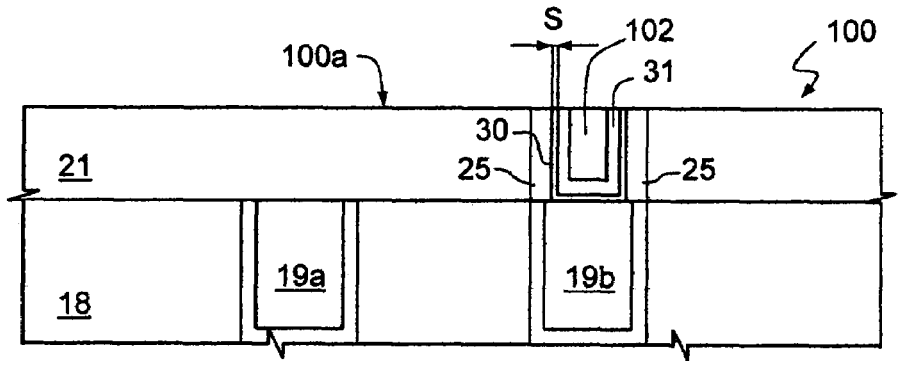
Figure 14:
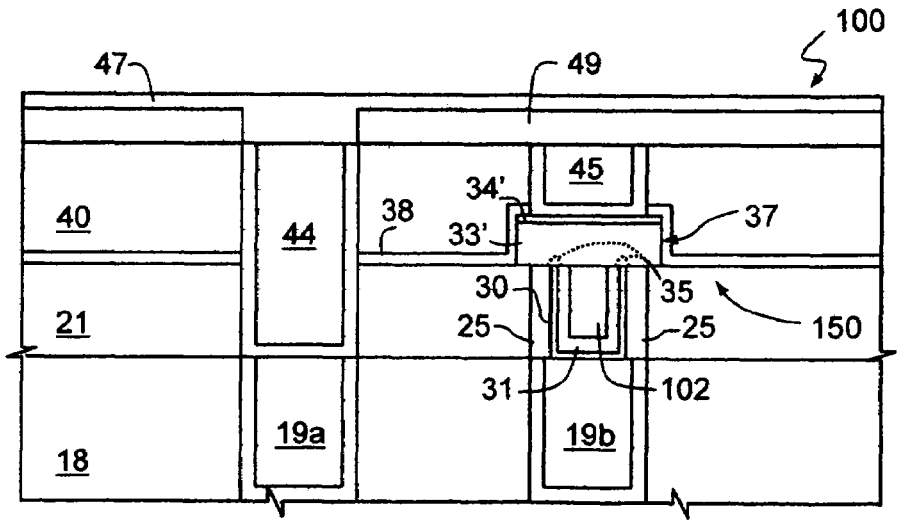
Figure 15:
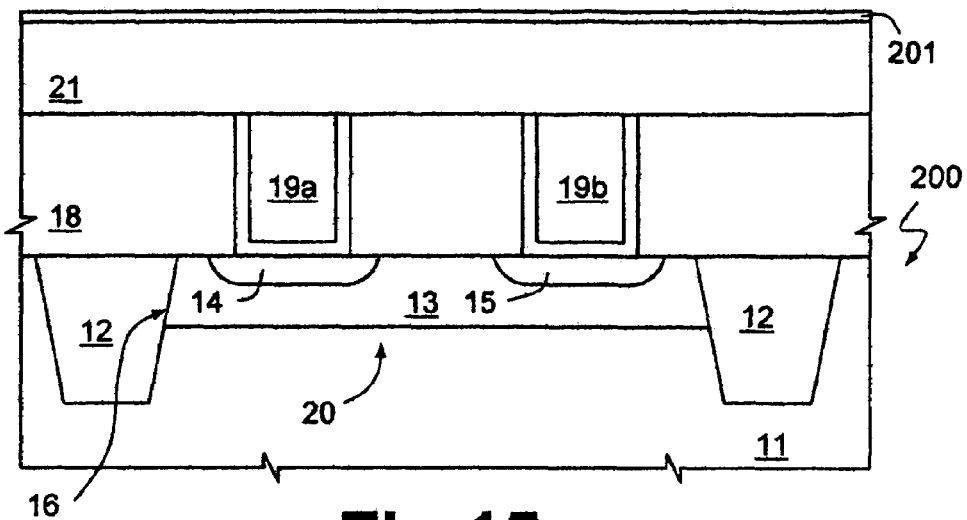
FIGS. 15-18 are cross sections through a semiconductor wafer in subsequent steps of a manufacturing process according to a third embodiment of the present invention.

A second embodiment of the invention is illustrated in FIGS. 12-14, where elements already shown are designated by the same reference numbers. In this case, all the steps required to prepare the structure of FIG. 4 are initially carried out in a semiconductor wafer 100, except in that an adhesion layer 101 is deposited in substitution of the third dielectric layer 28 (FIG. 12). The material forming the adhesion layer 101 is selected to provide good adhesion to a chalcogenide to be deposited later and is preferably a metal or doped silicon. E.g., TiSiN or TiAlN may be used with GST. Moreover, the adhesion layer 101 has good filling properties and is preferably deposited by CVD (chemical vapor deposition).

After planarization by CMP, FIG. 13, conductive cores 102 are formed inside the heaters 30 and are flush with a top surface 10a of the wafer 100. Moreover, conductive cores 102 are electrically isolated from the respective heaters 30, because of the sheath films 31 of silicon nitride. The chalcogenic layer 33 and the cap layer 34 are then deposited on the wafer 100. The chalcogenic layer 33, in particular, tightly adheres both to the heaters 30 and to the conductive cores 102, so that the risk of delamination is significantly reduced. In fact, metals adhere to chalcogenides much better than dielectrics.

The process is terminated as already described with reference to FIGS. 8-11. Namely, resistive bit lines 37 are formed by defining the chalcogenic layer 33 and the cap layer 34, and sealed by deposition of the sealing layer 38; the fourth dielectric layer 40 is deposited and polished and the word line contacts 44 and metal bit lines 45 are formed therein; and, finally, the word lines 47 and the connections (not shown) for the metal bit lines are made. Phase change memory cells 150 as shown in FIG. 14 are thus obtained.

By the provision of metallic cores 102, adhesion of the chalcogenic material is thus advantageously improved without adding any process steps and also without increasing the contact areas between the heaters 30 and the resistive bit lines 45. No currents may flow through the metallic cores 102 which are isolated from the heaters and the emitter contacts 19b.

According to a third embodiment of the invention, which is shown in FIGS. 15-20, selection elements 20, with base and emitter contacts 19a, 19b, are made in semiconductor wafer 200 as previously described with reference to FIG. 1. Next, the second dielectric layer 21 is formed and a first adhesion layer 201 is deposited thereon. The material forming the first adhesion layer 201 is selected to provide good adhesion to a chalcogenide to be deposited later thereon and is preferably a metal or doped silicon. E.g., TiSiN or TiAlN may be used with GST.

Figure 16:
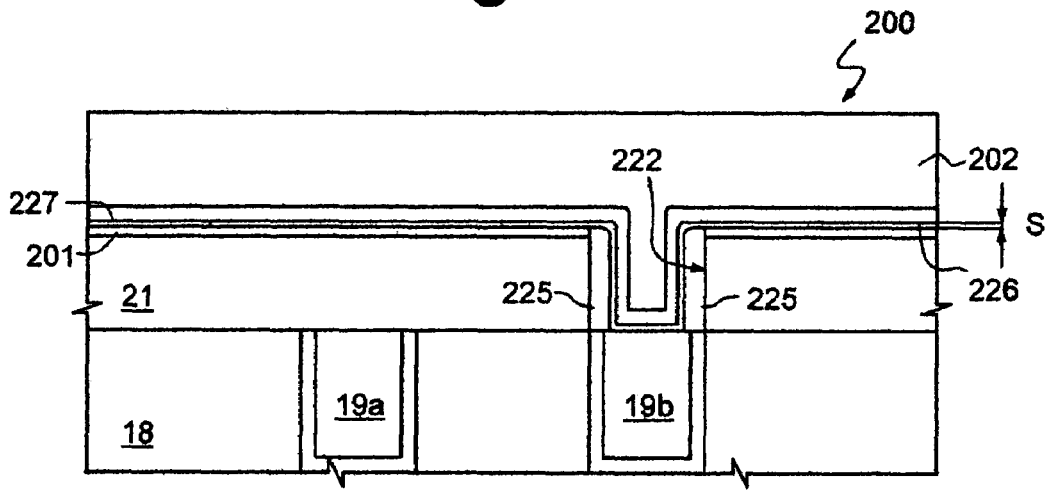

Then, FIG. 16, openings 222 are formed through the first adhesion layer 201 and the second dielectric layer 21 above the emitter contacts 19b and spacers 225 are made therein. The openings 222 initially have the first cross dimension D (around 120 nm) and are narrowed to the second cross dimension D' (50-60 nm) by forming the spacers 225. A heater layer 226, the thickness whereof has the sublithographic extent S (5-20 nm, preferably), is conformally deposited on the first adhesion layer 201 and is covered by a sheath layer 227, also conformally deposited. A second adhesion layer 202, preferably of the same material as the. first adhesion layer 201, is deposited on the sheath layer 227 and fills the openings 222.

Figure 17:
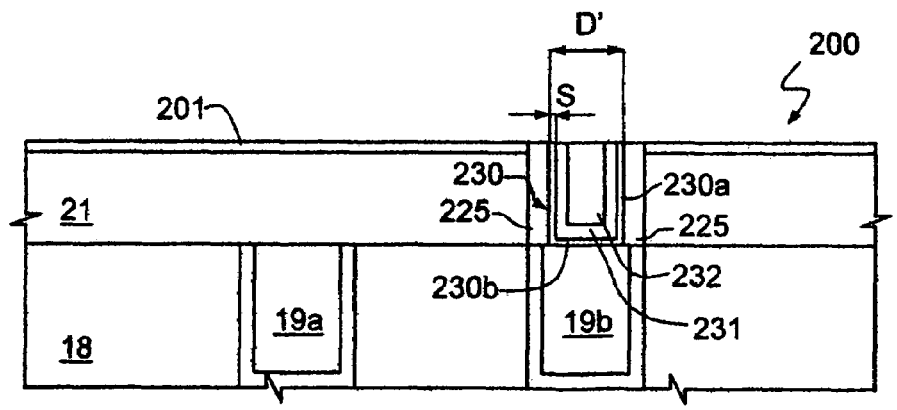
Figure 18:
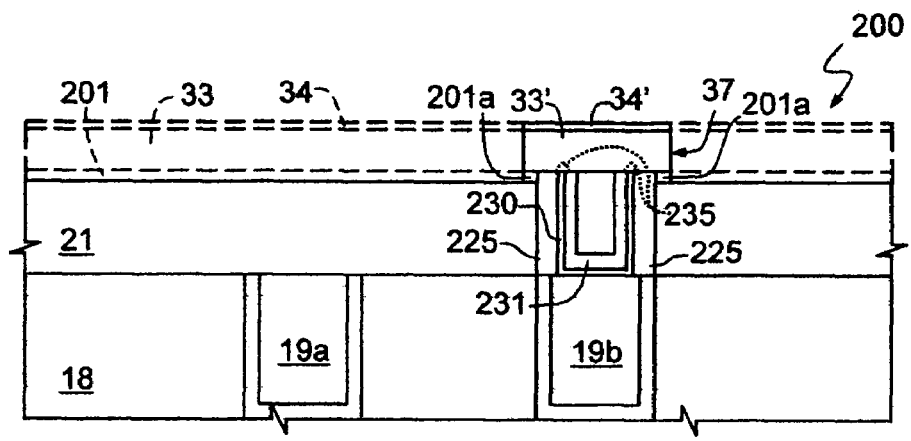
Figure 19:
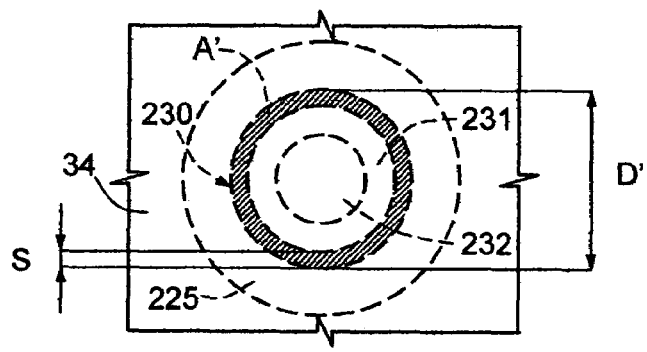
FIG. 19 is a top plan view of the wafer of FIG. 18.

As shown in FIG. 17, the wafer 200 is then planarized by a CMP step, which is terminated on reaching the first adhesion layer 201. In practice, the second adhesion layer 202, the sheath layer 227 and the heater layer 226 are removed outside the openings 222. Heaters 230, internally coated by sheath films 231 and filled by metallic cores 232, are thus formed in the openings 222. The heaters 230 include respective hollow, elongated tubular portions 230a and bottom portions 230b, arranged directly on the emitter contacts 19b. The diameter of the tubular portions 230a is equal to the second cross dimension D' and their radial thickness is equal to the sublithographic extent S.

The chalcogenic layer 33 and the cap layer 34 (illustrated by dashed lines in FIG. 18) are deposited and anisotropically etched along with the first adhesion layer 201 to define the resistive bit lines 37. Therefore, adhesion regions 201a, made from residual portions of the first adhesion layer 201, are arranged between the second dielectric layer 21 and the resistive bit lines 37 to prevent delamination thereof. In this step, also, memory elements 235 are formed in the chalcogenic layer 33 at contact areas A' with the heaters 230 (see FIG. 19). The contact areas A' are annular and have the same external diameter as the heaters 230 (i.e., the second cross-dimension D') and a width that is equal to the sublithographic extent S. Hereinafter, the term width will be used to indicate the distance between an external side and an internal side of an annular region or, generally, of a frame.

Figure 20:
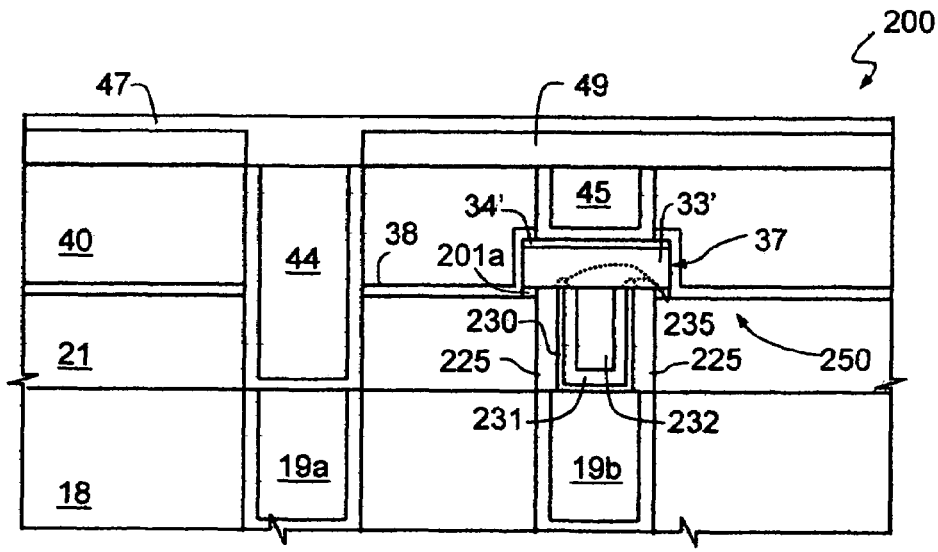
FIG. 20 is a cross section through the wafer of FIGS. 15-19, wherein a phase change memory device has been completed, according to the third embodiment of the present invention.

The process is terminated as already described. In particular, a sealing layer 38 and the fourth dielectric layer 40 are deposited; the fourth dielectric 40 is polished; the word line contacts 44 and metal bit lines 45 are formed therein; and, finally, the word lines 47 and the connections (not shown) for the metal bit 45 lines are made. Phase change memory cells 250 as shown in FIG. 20 are thus obtained.

In the above described embodiment, the first adhesion layer 201 definitely removes the risk of delamination of the chalcogenic layer 33, as well as the adhesion regions 201a provide sufficient adhesion for the resistive bit lines 37 before deposition of the sealing layer 38.

Figure 21:
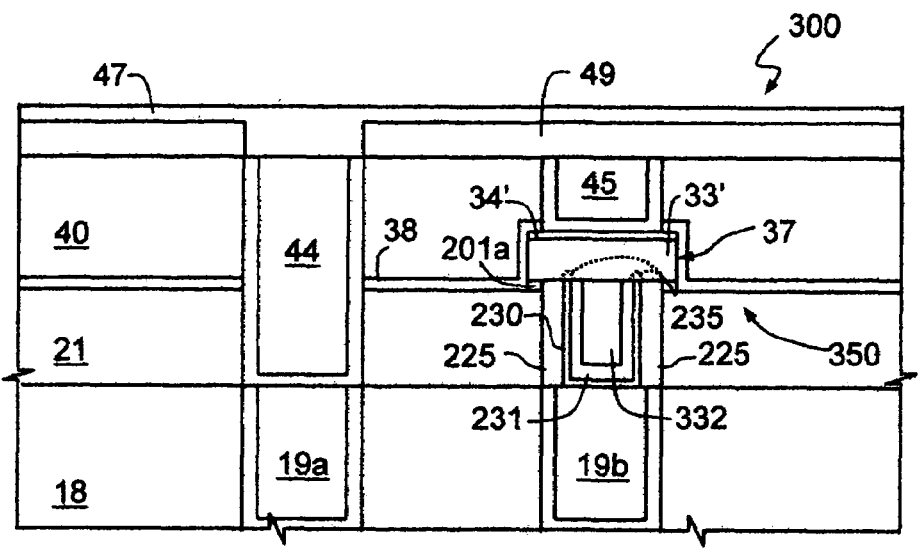
FIG. 21 is a cross section through a semiconductor wafer, wherein a phase change memory device has been completed, according to a fourth embodiment of the present invention.

FIG. 21 shows a fourth embodiment of the invention. A semiconductor wafer 300 includes a plurality of phase change memory cells 350 (only one is illustrated in FIG. 21, for the sake of simplicity). The phase change memory cells 350 have basically the same as the phase change memory cells 250 of FIG. 20, except in that the metallic cores 232, which fill the heaters 230, are replaced by dielectric cores 332, which are preferably deposited by ALD. In particular, the phase change memory device 300 includes the adhesion regions 201*a* between the second dielectric layer 21 and the resistive bit lines 37.

The manufacturing process is thus simpler and cheaper and the adhesion of the chalcogenide to the underlying structure is not impaired.

Figure 22:
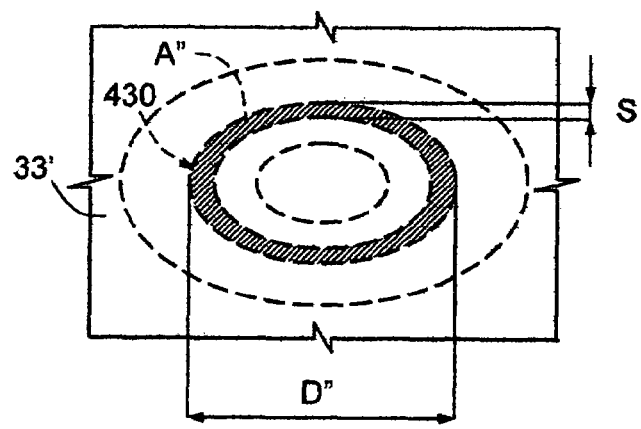
FIGS. 22 and 23 are top plan views, with removed parts, of details of phase change memory devices according to a fifth and a sixth embodiment of the present invention, respectively.
Figure 23:
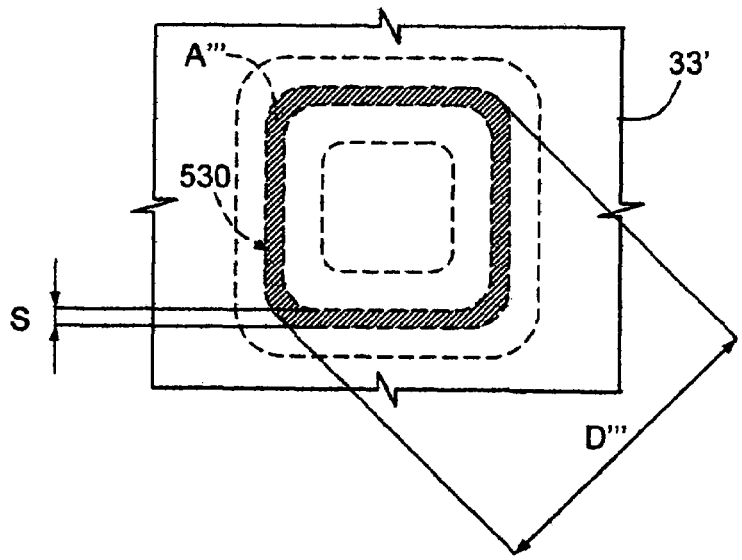

Alternative embodiments of the invention are shown in FIGS. 22 and 23. In the embodiment of FIG. 22, heaters 430 are ovalized and, therefore, contact areas A" with the chalcogenic regions 34' are in the form of ellipsoidal rings having a width equal to the sublithographic extent S and a maximum external dimension D" that is preferably sublithographic. In the embodiment of FIG. 23 heaters 530 are generally squared with rounded corners; hence also contact areas A' are squared frames with rounded corners, having a width equal to the sublithographic extent S and a maximum external dimension D' that is preferably sublithographic.

It is thus understood that the heaters need not be circular and the contact areas need not be circular rings. Other shapes of the contact areas would be acceptable, too. Basically, the shape of the heaters and of the contact areas is the same as the shape of the openings which are formed above the emitter contacts 19*b*. In fact, both the spacers layer and the heater layer are conformally deposited and, therefore, they comply with the profile of the second dielectric layer 21 and of the openings 22. In any case, the maximum external dimensions, and not only the radial thickness of the heaters (i.e., the width of the frames), are preferably sublithographic.

Figure 24:
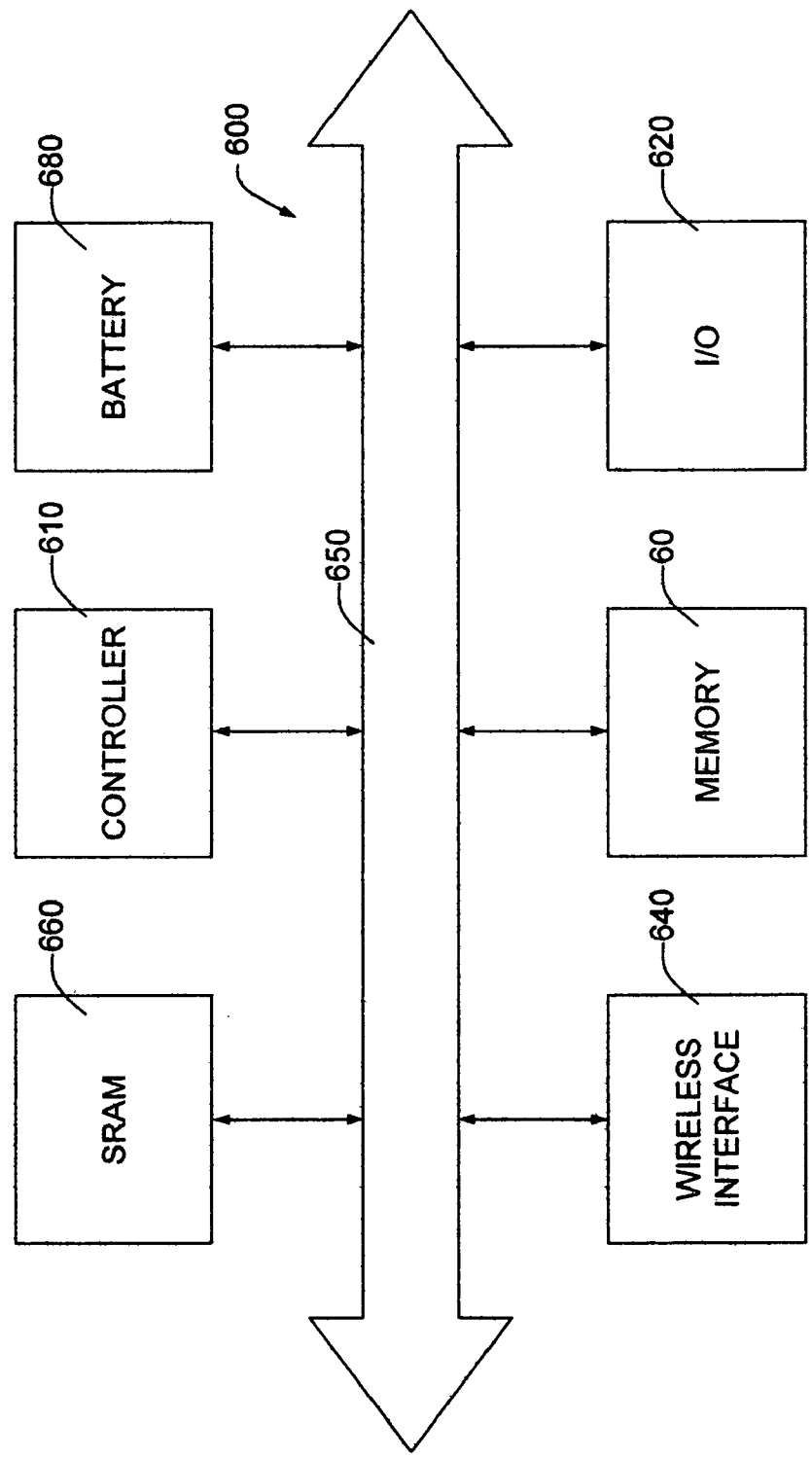
FIG. 24 is a system depiction of one embodiment of the present invention.

In FIG. 24, a portion of a system 600 in accordance with an embodiment of the present invention is described. System 600 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 600 may be used in any of the following systems: a wireless local area network (WLAN) system, a wireless personal area network (WPAN) system, or a cellular network, although the scope of the present invention is not limited in this respect.

System 600 may include a controller 610, an input/output (I/O) device 620 (e.g., a keypad, display), the phase change memory device 60, a wireless interface 640, and a static random access memory (SRAM) 660 and coupled to each other via a bus 650. A battery 680 may supply power to the system 600 in one embodiment. It should be noted that the scope of the present invention is not limited to embodiments having any or all of these components.

Controller 610 may comprise, for example, one or more microprocessors, digital signal processors, micro-controllers, or the like. The phase change memory device 60 may be used to store messages transmitted to or by system 600. The phase change memory device 60 may also optionally be used to store instructions that are executed by controller 610 during the operation of system 600, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 620 may be used to generate a message. The system 600 may use the wireless interface 640 to transmit and receive messages to and from a wireless communication network with a radio frequency (RF) signal. Examples of the wireless interface 640 may include an antenna, or a wireless transceiver, such as a dipole antenna, although the scope of the present invention is not limited in this respect. Also, the I/O device 620 may deliver a voltage reflecting what is stored as either a digital output (if digital information was stored), or as analog information (if analog information was stored).

While an example in a wireless application is provided above, embodiments of the present invention may also be used in non-wireless applications as well.

Finally, it is clear that numerous variations and modifications may be made to the phase change memory cell and process described and illustrated herein, all falling within the scope of the invention as defined in the attached claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A phase change memory cell comprising:
   a phase change region of a phase change material; and
   a heating element of a resistive material, arranged in contact with said phase change region along an entire contact area, the phase change region including a memory element adjacent to the contact area, wherein said heating element is in the form of a frame having a thickness defined by an external perimeter and an internal perimeter, the external perimeter having a first linear cross-dimension from a first side of the external perimeter to an opposite, second side of the external perimeter that is less than 100 nm;
   a dielectric sheath film positioned within the inner perimeter of the heating element frame, the sheath film being shaped as a frame having a central opening; and
   a conductive core centrally located within the frame of the heating element and completely filling the opening of the dielectric sheath film.

2. A memory cell according to claim 1, wherein said contact area has a second linear cross-dimension from a third side of the external perimeter to an opposite, fourth side of the external perimeter that is less than 100 nm, the first and second linear cross-dimensions being substantially perpendicular to one another.

3. A memory cell according to claim 1, wherein said heating element includes a hollow elongated portion defined by a tubular element.

4. A memory cell according to claim 3, wherein said hollow elongated portion extends to the contact area in contact with said phase change region.

5. A memory cell according to claim 4, wherein the external perimeter of said heating element has a has a maximum external cross-dimension that is less than 100 nm.

6. A memory cell according to claim 1, wherein said conductive core is of metal.

7. A memory cell according to claim 1, wherein said conductive core is directly in contact with said phase change region.

8. A memory cell according to claim 3, wherein said heating element is at least partially embedded in a structural layer.

9. A memory cell according to claim 8, further comprising adhesion regions arranged between said structural layer and said phase change region.

10. A process for manufacturing a phase change memory cell, comprising the steps of:
- forming a heating element, of a resistive material; and
- forming a phase change region, of a phase change material, on and in contact with said heating element along an entire contact area, thereby forming a memory element in said phase change region adjacent to the contact area of said phase change region and of said heating element;
- wherein said heating element is in the form of a frame having a thickness defined by an external perimeter and an internal perimeter, the external perimeter having a first linear cross-dimension from a first side of the external perimeter to an opposite, second side of the external perimeter that is less than 100 nm;
- forming a dielectric sheath film positioned within the inner perimeter of the heating element frame, the sheath film including a frame having a central opening; and
- forming a conductive core centrally located within the frame of the heating element and completely filling the opening of the dielectric sheath film.

11. A process according to claim 10, wherein the external perimeter of said contact area and heating element have a second linear cross-dimension from a third side of the external perimeter to an opposite, fourth side of the external perimeter that is less than 100 nm, the first and second linear cross-dimensions being substantially perpendicular to one another.

12. A process according to claim 10, wherein said step of forming said heating element comprises:
- forming an opening in a structural layer; and
- conformally depositing a heater layer of said resistive material on said structural layer and in said opening, a thickness of said heater layer being less than 100 nm.

13. A process according to claim 12, wherein said contact area has a maximum external dimension less than 100 nm and the step of forming an opening includes forming a lithographic opening having a lithographic cross-dimension and narrowing said lithographic opening to a cross-dimension which is equal to said maximum external dimension.

14. A process according to claim 13, wherein said step of narrowing includes forming spacers inside said lithographic opening.

15. A process according to claim 12, wherein said step of forming said phase change region comprises depositing a phase change layer directly on said structural layer and in contact with said heating element.

16. A process according to claim 12, wherein an adhesion layer is deposited on said structural layer before forming said heating element.

17. A process according to claim 16, wherein said step of forming said phase change region comprises depositing a phase change layer on said adhesion layer after forming said heating element.

18. A process according to claim 17, wherein said phase change layer is deposited in contact with said heating element.

19. A process according to claim 16, further comprising the step of removing said adhesion layer outside said phase change region.

20. A process according to claim 16, wherein said adhesion layer is of metal.

21. A phase change memory device, comprising:
- a plurality of phase change memory cells, each memory cell including:
- a phase change region of a phase change material;
- a heating element of a resistive material, arranged in contact with said phase change region along an entire contact area, the phase change region including a memory element adjacent to the contact area, wherein said heating element is in the form of a frame having a thickness defined by an external perimeter and an internal perimeter, the external perimeter having a first linear cross-dimension from a first side of the external perimeter to an opposite, second side of the external perimeter that is less than 100 nm;
- a dielectric sheath film positioned within the inner perimeter of the heating element frame, the sheath film being shaped as a frame having a central opening; and
- a conductive core centrally located within the frame of the heating element and completely filling the opening of the dielectric sheath film.

22. A memory device according to claim 21, wherein said contact area has a second linear cross-dimension from a third side of the external perimeter to an opposite, fourth side of the external perimeter that is less than 100 nm, the first and second linear cross-dimensions being substantially perpendicular to one another.

23. A memory device according to claim 21, wherein said heating element includes a hollow elongated portion defined by a tubular element.

24. A memory device according to claim 21, wherein said heating element includes a hollow elongated portion that is filled with the conductive core and is electrically isolated therefrom by the sheath film.

25. A memory device according to claim 24, wherein said conductive core is directly in contact with said phase change region.

26. A system comprising:
- a processing unit;
- an interface coupled to said processing unit; and
- a nonvolatile phase change memory device, coupled to said processing unit and including a plurality of phase change memory cells, each phase change memory cell including:
- a phase change region of a phase change material;
- a heating element of a resistive material, arranged in contact with said phase change region along an entire contact area, the phase change region including a memory element adjacent to the contact area, wherein said heating element is in the form of a frame having a thickness defined by an external perimeter and an internal perimeter, the external perimeter having a first linear cross-dimension from a first side of the external perimeter to an opposite, second side of the external perimeter that is less than 100 nm;
- a dielectric sheath film positioned within the inner perimeter of the heating element frame, the sheath film being shaped as a frame having a central opening; and
- a conductive core centrally located within the frame of the heating element and completely filling the opening of the dielectric sheath film.

27. A system according to claim 26, wherein said interface is a wireless interface.

28. A system according to claim 26, wherein said heating element includes a hollow elongated portion that is filled with the conductive core and is electrically isolated therefrom by the dielectric sheath film.

29. A phase change memory cell comprising:
- a phase change region of a phase change material;
- a heating element of a resistive material, arranged in contact with said phase change region along an entire contact area, the phase change region including a memory element adjacent to the contact area, wherein said heating element is in the form of a frame having a thickness defined by an external perimeter and an internal perimeter, the external perimeter having a first linear cross-dimension from a first side of the external perimeter to an opposite, second side of the external perimeter that is less than 100 nm a sheath film of a dielectric material positioned within the inner perimeter of the heating element frame, the sheath film including a frame having a central opening; and a conductive core centrally located within the frame of the heating element and completely filling the opening of the sheath film.

30. A memory cell according to claim 29, wherein said contact area has a second linear cross-dimension from a third side of the external perimeter to an opposite, fourth side of the external perimeter that is less than 100 nm, the first and second linear cross-dimensions being substantially perpendicular to one another.

31. A memory cell according to claim 29, wherein said heating element includes hollow elongated portion defined by a tubular element.

32. A memory cell according to claim 29, wherein said conductive core is directly in contact with said phase change region.

33. A memory cell according to claim 29, further comprising:

a structural layer in which said heating element is at least partially embedded; and adhesion regions arranged between said structural layer and said phase change region.

* * * * *